(12) United States Patent
Lee et al.

(10) Patent No.: US 10,393,806 B2
(45) Date of Patent: Aug. 27, 2019

(54) ORGANIC LIGHT EMITTING DISPLAY DEVICE AND METHOD OF MANUFACTURING THE SAME

(71) Applicant: LG DISPLAY CO., LTD., Seoul (KR)

(72) Inventors: JaeSung Lee, Seoul (KR); Joonsuk Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/923,114

(22) Filed: Mar. 16, 2018

(65) Prior Publication Data

US 2018/0203062 A1 Jul. 19, 2018

Related U.S. Application Data

(63) Continuation of application No. 15/336,073, filed on Oct. 27, 2016, now Pat. No. 9,952,284.

(30) Foreign Application Priority Data

Oct. 30, 2015 (KR) .................... 10-2015-0152620

(51) Int. Cl.
*H01L 51/52* (2006.01)
*G01R 31/3177* (2006.01)
(Continued)

(52) U.S. Cl.
CPC ... *G01R 31/3177* (2013.01); *G01R 31/31723* (2013.01); *G01R 31/31727* (2013.01); *G01R 31/318555* (2013.01); *G01R 31/318572* (2013.01); *G06F 11/26* (2013.01); *H01L 27/3246* (2013.01); *H01L 27/3248* (2013.01); *H01L 27/3258* (2013.01); *H01L 27/3262* (2013.01); *H01L 51/5212* (2013.01); *H01L 51/5215* (2013.01); *H01L 51/5228* (2013.01); *H01L 51/5253* (2013.01); *H01L 51/56* (2013.01); *H01L 27/1222* (2013.01); *H01L 27/1225* (2013.01); *H01L 27/1248* (2013.01); *H01L 2227/323* (2013.01);
(Continued)

(58) Field of Classification Search
CPC ............ H01L 27/3258; H01L 27/3246; H01L 51/5228; H01L 27/1222; H01L 27/1248
See application file for complete search history.

(56) References Cited

U.S. PATENT DOCUMENTS 8,618,546 B2 * 12/2013 Jeong ................. H01L 27/1225
257/379
2001/0051398 A1 * 12/2001 Hirakata ............. G02F 1/13454
438/149
(Continued)

FOREIGN PATENT DOCUMENTS

JP 2010-153171 A 7/2010

*Primary Examiner* — Donald L Raleigh
(74) *Attorney, Agent, or Firm* — Dentons US LLP

(57) ABSTRACT

Disclosed is an organic light emitting display (OLED) device that may include a thin film transistor on a substrate; a first electrode electrically connected with the thin film transistor; an organic emitting layer on the first electrode, the organic emitting layer separated by a partition; a partition cover on the partition; a second electrode on the organic emitting layer; and an encapsulation layer on the second electrode, wherein a width of an upper surface of the partition cover is smaller than a width of a lower surface of the partition cover.

13 Claims, 5 Drawing Sheets

(51) Int. Cl.
  *G01R 31/317* (2006.01)
  *G01R 31/3185* (2006.01)
  *G06F 11/26* (2006.01)
  *H01L 27/32* (2006.01)
  *H01L 51/56* (2006.01)
  *H01L 27/12* (2006.01)

(52) U.S. Cl.
  CPC .. *H01L 2251/301* (2013.01); *H01L 2251/308* (2013.01); *H01L 2251/5315* (2013.01)

(56) References Cited

U.S. PATENT DOCUMENTS

| | | | |
|---|---|---|---|
| 2005/0078099 A1* | 4/2005 | Amundson | H01L 27/12 345/204 |
| 2005/0104516 A1 | 5/2005 | Park et al. | |
| 2008/0287028 A1 | 11/2008 | Ozawa | |
| 2011/0127500 A1 | 6/2011 | Ko et al. | |
| 2012/0161167 A1* | 6/2012 | Yamazaki | H01L 27/3204 257/88 |
| 2013/0099218 A1 | 4/2013 | Lee et al. | |
| 2013/0248867 A1* | 9/2013 | Kim | H01L 51/5253 257/59 |
| 2014/0183479 A1 | 7/2014 | Park et al. | |
| 2014/0183483 A1* | 7/2014 | Kim | H01L 51/5228 257/40 |
| 2014/0217394 A1* | 8/2014 | Kin | H01L 51/5253 257/40 |
| 2014/0312323 A1 | 10/2014 | Park et al. | |
| 2015/0014636 A1 | 1/2015 | Kang | |
| 2015/0179718 A1* | 6/2015 | Kim | H01L 27/3246 257/40 |

* cited by examiner

ORGANIC LIGHT EMITTING DISPLAY DEVICE AND METHOD OF MANUFACTURING THE SAME

CROSS REFERENCE TO RELATED APPLICATIONS

This application is a Continuation Application of U.S. patent application Ser. No. 15/336,073 filed on Oct. 27, 2016, which claims the benefit of Korean Patent Application No. 10-2015-0152620, filed on Oct. 30, 2015, which is incorporated by reference as if fully set forth herein.

BACKGROUND

Field of the Disclosure

Embodiments of the present invention relate to an organic light emitting display device, and more particularly, to a top emission type organic light emitting display device.

Discussion of the Related Art

An organic light emitting display (OLED) device, which is a self light emitting display device, has advantages of low power consumption, rapid response speed, high emission efficiency, high luminance and wide viewing angle.

According to a direction of the light emitted from an OLED device, the OLED device may be largely classified into a top emission type and a bottom emission type. In case of the bottom emission type, a circuit device is disposed between a light emitting layer and an image displaying surface, which may lower aperture ratio due to the circuit device. Meanwhile, in case of the top emission type, a circuit device is typically not disposed between a light emitting layer and an image displaying surface and thus, is more advantageous from an aperture ratio standpoint.

FIG. 1 is a cross sectional view of a top emission type OLED device according to the related art.

As shown in FIG. 1, a thin film transistor layer (T) including an active layer 11, a gate insulating film 12, a gate electrode 13, an insulating interlayer 14, a source electrode 15, and a drain electrode 16 is provided on a substrate 10, and then a passivation layer 20 and a planarization layer 30 are sequentially provided on the thin film transistor layer (T).

An anode electrode 40 is then provided on the planarization layer 30. On the anode electrode 40, a bank 50 is provided to define a pixel region. Also, an organic emitting layer 60 is provided in the pixel region defined by the bank 50, and a cathode electrode 70 is provided on the organic emitting layer 60.

In case of the top emission type, the light emitted from the organic emitting layer 60 passes through the cathode electrode 70. To do so, the cathode electrode 70 is typically formed of a transparent conductive material.

However, when the OLED device according the related art is subject to impact by repetitive bending actions, the organic emitting layer 60 may be separated from the cathode electrode 70, to thereby lower reliability of the OLED device.

SUMMARY

Accordingly, embodiments of the present invention are directed to an organic light emitting display device and a method of manufacturing the same that substantially obviate one or more problems due to limitations and disadvantages of the related art.

An aspect of embodiments of the present invention is directed to provide a top emission type organic light emitting display device with enhanced reliability, and a method of manufacturing the same.

Additional features and advantages of the present invention will be set forth in the description which follows, and in part will be apparent from the description, or may be learned by practice of the invention. These and other advantages of the present invention will be realized and attained by the structure particularly pointed out in the written description and claims hereof as well as the appended drawings.

To achieve these and other advantages and in accordance with the purpose of embodiments of the invention, as embodied and broadly described herein, an OLED device may, for example, include a thin film transistor on a substrate; a first electrode electrically connected with the thin film transistor; an organic emitting layer on the first electrode, organic emitting layer separated by a partition; a partition cover on the partition; a second electrode on the organic emitting layer; and an encapsulation layer on the second electrode, wherein a width of an upper surface of the partition cover is smaller than a width of a lower surface of the partition cover.

In another aspect, a method of manufacturing an OLED device may, for example, include providing a thin film transistor on a substrate; providing a first electrode electrically connected with the thin film transistor, and providing an auxiliary electrode in the same layer as the first electrode; providing a partition on the auxiliary electrode; providing a bank at a lateral side of the first electrode and the auxiliary electrode; providing a partition cover on the partition; providing an organic emitting layer on the first electrode; providing a second electrode on the organic emitting layer; and providing an encapsulation layer on the second electrode, wherein a width of an upper surface of the partition cover is smaller than a width of a lower surface of the partition cover.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE ILLUSTRATED EMBODIMENTS

Terms disclosed in this specification should be understood as follows. The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Hereinafter, reference will now be made in detail to embodiments of the present disclosure, examples of which are illustrated in the accompanying drawings. Wherever possible, the same reference numbers will be used throughout the drawings to refer to the same or like parts. Also, in the following description of the present disclosure, if detailed description of elements or functions known is determined to make the subject matter of the present disclosure unnecessarily obscure, the detailed description thereof will be omitted.

Figure 1:
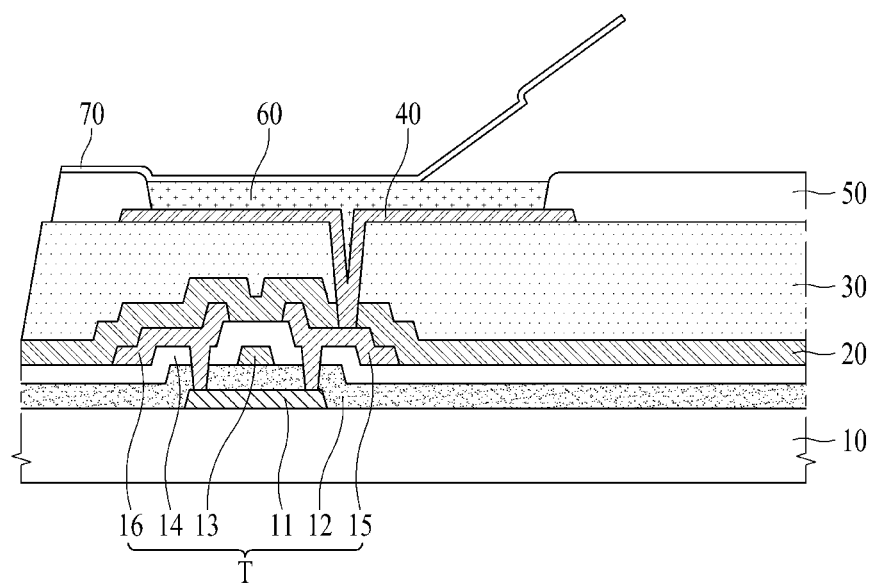
FIG. 1 is a cross-sectional view illustrating a top emission type OLED device according to the related art.
Figure 2:
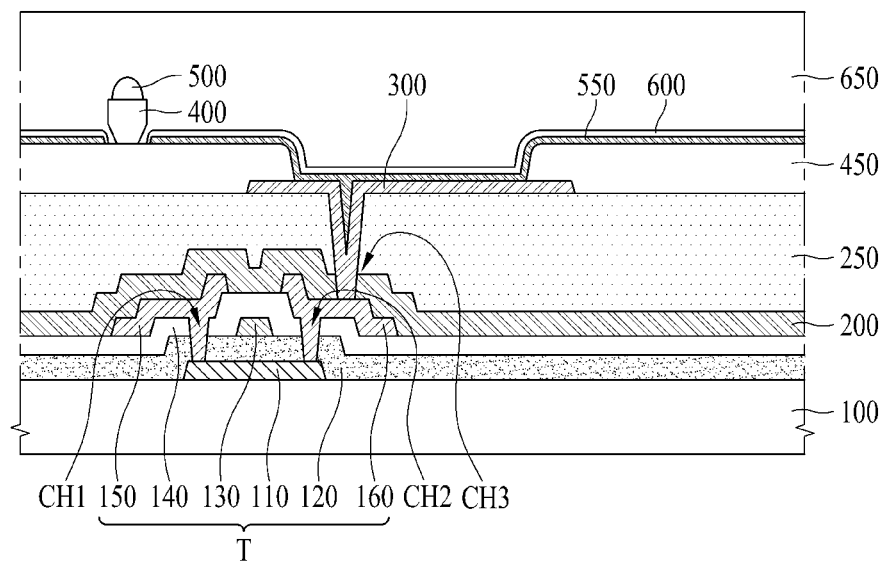
FIG. 2 is a cross-sectional view illustrating an OLED device according to one embodiment of the present invention.

FIG. 2 is a cross-sectional view illustrating an OLED device according to one embodiment of the present invention.

Referring to FIG. 2, the OLED device includes a thin film transistor (T), a passivation layer 200, a planarization layer 250, a first electrode 300, a partition 400, a bank 450, a partition cover 500, an organic emitting layer 550, a second electrode 600 and an encapsulation layer 650 on a substrate 100.

The thin film transistor (T) may include an active layer 110, a gate insulating film 120, a gate electrode 130, an insulating interlayer 140, a source electrode 150, and a drain electrode 160.

The active layer 110 is provided on the substrate 100, and is overlapped with the gate electrode 130. The active layer 110 may be formed of a silicon-based semiconductor material, or an oxide-based semiconductor material. Although not shown, a light-shielding layer may be additionally provided between the substrate 100 and the active layer 110.

The gate insulating film 120 is disposed on the active layer 110. The gate insulating film 120 is provided to insulate the active layer 110 and the gate electrode 130 from each other. In this case, the gate insulating film 120 may be formed in a single layer of an inorganic insulating material such as silicon oxide (SiOx) or silicon nitride (SiNx), or a multi-layered structure including one or more of silicon oxide (SiOx) and silicon nitride (SiNx), but the embodiment is not limited to these structures.

The gate electrode 130 is provided on the gate insulating film 120. The gate electrode 130 overlaps with the active layer 110, and the gate insulating film 120 is interposed between the gate electrode 130 and the active layer 110 being overlapped with each other. The gate electrode 130 may be formed in a single layer or a multi-layered structure including, for example, one or more of molybdenum (Mo), aluminum (Al), chrome (Cr), aurum (Au), titanium (Ti), nickel (Ni), neodymium (Nd), copper (Cu) and their alloys, but the embodiment is not limited to these materials.

The insulating interlayer 140 is provided on the gate electrode 130. The insulating interlayer 140 is formed of the same material as the gate insulating film 120. For example, the insulating interlayer 140 may be formed in a single layer of an inorganic insulating material such as silicon oxide (SiOx) or silicon nitride (SiNx), or a multi-layered structure including one or more of silicon oxide (SiOx) and silicon nitride (SiNx), but the embodiment is not limited to these materials and structures.

The source electrode 150 and the drain electrode 160 confronting each other are provided on the insulating interlayer 140. A first contact hole (CH1) for exposing one end of the active layer 110 is provided in the gate insulating film 120 and the insulating interlayer 140, and a second contact hole (CH2) for exposing the other end of the active layer 110 is provided in the gate insulating film 120 and the insulating interlayer 140. The source electrode 150 is connected with the other end of the active layer 110 via the first contact hole (CH1), and the drain electrode 160 is connected with one end of the active layer 110 via the second contact hole (CH2).

The thin film transistor layer (T) is not limited to the above-described structure, and the thin film transistor layer (T) may be changed to various structures and shapes generally known to those in the art. For example, FIG. 2 illustrates a top gate structure where the gate electrode 130 is provided on the active layer 110, but it is possible to provide, for example, a bottom gate structure where the gate electrode 130 is provided below the active layer 110.

The passivation layer 200 is provided on the thin film transistor layer (T) to protect the thin film transistor layer (T). The passivation layer 200 may be formed of an inorganic insulating material, for example, silicon oxide film (SiOx) or silicon nitride film (SiNx), but is not limited to these materials.

The planarization layer 250 is provided on the passivation layer 200 to planarize an upper surface of the substrate 100 with the thin film transistor layer (T). The planarization layer 250 may be formed of an organic insulating material, for example, acryl resin, epoxy resin, phenolic resin, polyamide resin, polyimide resin, and etc., but is not limited to these materials.

The first electrode 300 is disposed on the planarization layer 250. A third contact hole (CH3) for exposing the drain electrode 160 is prepared in the passivation layer 200 and the planarization layer 250, and the first electrode 300 is connected with the drain electrode 160 via the third contact hole (CH3). That is, the first electrode 300 is electrically connected with the thin film transistor (T). In this case, the first electrode 300 is separately disposed in every pixel. For example, the first electrode 300 may function as an anode electrode. The first electrode 300 may be formed of indium-tin-oxide (ITO) or indium-zinc-oxide (IZO). Also, the first electrode 300 may be formed to have a multi-layered structure including metal materials with high reflection efficiency, for example, molybdenum (Mo), alloy (MoTi) of molybdenum (Mo) and titanium (Ti), aluminum (Al), argentums (Ag), APC (Ag;Pb;Cu), and etc.

The partition 400 is disposed on the bank 450 to separate the organic emitting layer 550. In order to provide the partition 400 whose upper surface serves as eaves, a width of an upper surface of the partition 400 is larger than a width of a lower surface of the partition 400. During a process of depositing the organic emitting layer 550, the upper surface of the partition 400 serves as the eaves so that the organic emitting layer 550 is not deposited on an area below the eaves. That is, there may be no need for a mask pattern covering the upper surface of the bank 450. If the gap space is covered by the upper surface of the partition 400 serving as the eaves, it is possible to reduce or prevent the organic emitting layer 550 from being permeated into the gap space. Since the organic emitting layer 550 can be manufactured by a deposition process using a deposition material with superior straightness, the organic emitting layer 550 may not be deposited in the gap space during the deposition process. The partition 400 may be formed of a photo-sensitive material whose portion exposed to light is cured.

The bank 450 is provided on the first electrode 300. The bank 450 is partially overlapped with the first electrode 300. That is, the bank 450, which exposes the upper surface of the first electrode 300, is provided on one side and the other side of the first electrode 300 so as to cover a lateral surface of the first electrode 300. As the bank 450 is provided to expose the upper surface of the first electrode 300, it is possible to secure an image-displaying area. The bank 450 may be formed of an organic insulating material, for example, polyimide resin, acryl resin, benzocyclobutene BCB, and etc., but is not limited to these materials.

The partition cover 500 is disposed on the partition 400. The partition cover 500 and the bank 450 may be formed of the same material and at the same time. In order to reduce a contact with a mask for a manufacturing process, a width of an upper surface of the partition cover 500 is smaller than a width of a lower surface of the partition cover 500. During a deposition process of the organic emitting layer 550, the upper surface of the partition cover 500 serves as a supporter of the mask, so that it is possible to reduce or prevent the supporter from being in contact with the upper surface of the partition 400.

In case of the related art OLED device, the partition cover 500 is not provided on the partition 400, and thus, the mask for depositing the organic emitting layer 550 may be in contact with the upper surface of the partition 400. If the mask is in contact with the partition 400 with the upper surface having a relatively-large width, the mask may be contaminated by foreign matters of the partition 400. Also, the first electrode 300 may be contaminated by the foreign matters during a process of transferring the mask. In the OLED device according to one embodiment of the present disclosure, the partition cover 500 with the upper surface having a relatively-small width is disposed on the partition 400 so that it is possible to reduce or minimize a contact area with the mask, and furthermore, to reduce or prevent defects caused by the foreign matters of the mask.

The organic emitting layer 550 is disposed on the first electrode 300. The organic emitting layer 550 may include a hole injecting layer, a hole transporting layer, an emitting layer, an electron transporting layer, and an electron injecting layer. A structure of the organic emitting layer 550 may be changed to various shapes generally known to those in the art. The organic emitting layer 550 may extend to the upper surface of the bank 450. However, when the organic emitting layer 550 extends to the upper surface of the bank 450, the organic emitting layer 550 is not formed in the gap space prepared between the lower surface of the partition 400 and the bank 450 by the partition 400.

The second electrode 600 is provided on the organic emitting layer 550. In this case, if the first electrode 300 functions as an anode electrode, the second electrode 600 functions as a cathode electrode. As the second electrode 600 is provided on a surface from which light is emitted, the second electrode 600 is formed of a transparent conductive material. In the same manner as the organic emitting layer 550, the second electrode 600 is not formed in the gap space prepared between the lower surface of the partition 400 and the bank 450 by the partition 400. If the second electrode 600 is manufactured by a sputtering process using a deposition material with less straightness, the second electrode 600 may be deposited in the gap space during the deposition process.

The encapsulation layer 650 for preventing a permeation of moisture may be entirely provided on the second electrode 600. The encapsulation layer 650 may be formed of various materials generally known to those in the art. The encapsulation layer 650 may be prepared in the gap space between the partition 400 and the bank 450. That is, the encapsulation layer 650 is prepared in the gap space, and is disposed while being inserted into the space between the lower surface of the partition 400 and the bank 450, whereby the encapsulation layer 650 is not separated from the second electrode 600. Also, the encapsulation layer 650 is provided in the gap space so that it is possible to fixedly provide the second electrode 600 and the organic emitting layer 550 without separation.

In the OLED device according to one embodiment of the present invention, the partition 400 is disposed in-between the organic emitting layer 550 and also disposed in-between the second electrode 600, and the encapsulation layer 650 is provided in the space between the partition 400 and the bank 450, to thereby fixedly provide the encapsulation layer 650. Accordingly, the encapsulation layer 650 of the OLED device according to one embodiment of the present invention presses the organic emitting layer 550 and the second electrode 600, to thereby enhance an adhesive strength between the organic emitting layer 550 and the second electrode 600. Accordingly, even when an impact is applied by repetitive bending actions, it is possible to reduce or prevent the organic emitting layer 550 from being separated from the cathode electrode 600, to thereby improve reliability.

Figure 3:
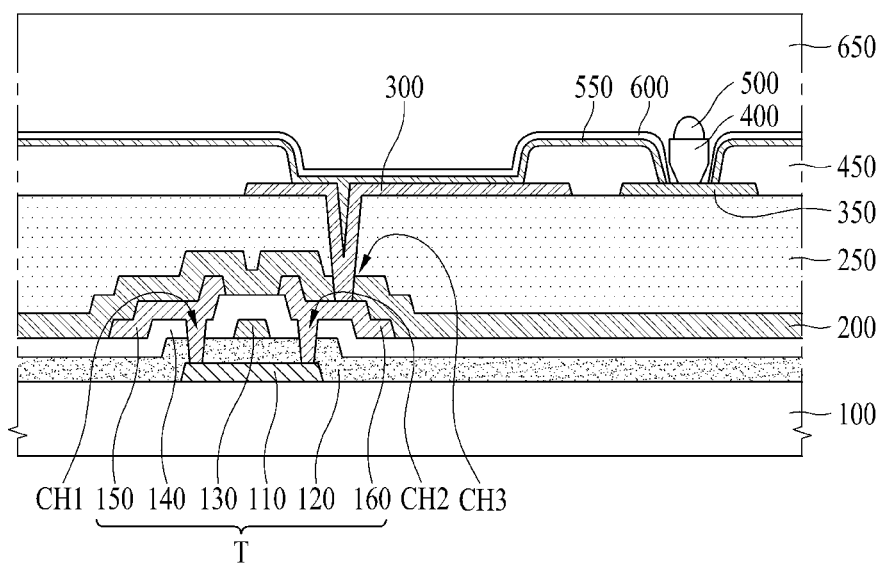
FIG. 3 is a cross-sectional view illustrating an OLED device according to another embodiment of the present invention.

FIG. 3 is a cross-sectional view illustrating an OLED device according to another embodiment of the present invention. Except an auxiliary electrode, a partition, and a bank, the OLED device of FIG. 3 is the same as the OLED device of FIG. 2. Hereinafter, the auxiliary electrode, partition, and bank will be described in detail, and a detailed description for the same parts will be omitted.

An auxiliary electrode 350 is disposed on a planarization layer 250. That is, the auxiliary electrode 350 is disposed in the same layer as a first electrode 300. In order to reduce a resistance of a second electrode 600, the auxiliary electrode 350 is electrically connected with the second electrode 600. The auxiliary electrode 350 is connected with the second electrode 600 through an area without the bank 450, and an area exposed to a lower side of a partition 400.

The partition 400 is disposed on the auxiliary electrode 350, wherein the partition 400 is provided to separate an organic emitting layer 550. In order to provide the partition 400 whose upper surface serves as eaves, a width of an upper surface of the partition 400 is larger than a width of a lower surface of the partition 400. During a process of depositing the organic emitting layer 550, the upper surface of the partition 400 serves as the eaves so that the organic emitting layer 550 is not deposited on an area below the eaves. That is, there may be no need for a mask pattern covering the upper surface of the auxiliary electrode 350. If the gap space is covered by the upper surface of the partition 400 serving as the eaves, it is possible to reduce or prevent the organic emitting layer 550 from being permeated into the gap space. Since the organic emitting layer 550 is manufactured by a deposition process using a deposition material with superior straightness, the organic emitting layer 550 is not deposited in the gap space between the partition 400 and the auxiliary electrode 350 during the deposition process. The partition 400 may be formed of a photo-sensitive material whose portion exposed to light is cured.

The bank 450 is disposed on the first electrode 300 and the auxiliary electrode 350. The bank 450 is partially overlapped with the first electrode 300 and the auxiliary electrode 350. That is, the bank 450, which exposes the upper surface of the first electrode 300 and the auxiliary electrode 350, is provided on one side and the other side of the first electrode 300 and the auxiliary electrode 350 so as to cover the lateral surface of the first electrode 300 and the auxiliary electrode 350. According as the bank 450 is provided to expose the upper surface of the first electrode 300, it is possible to secure an image-displaying area. Also, as the bank 450 is provided to expose the upper surface of the auxiliary electrode 350, it is possible to secure an electrical connection space between the auxiliary electrode 350 and the second electrode 600. The bank 450 is disposed between the first electrode 300 and the auxiliary electrode 350, to thereby electrically insulate the first electrode 300 and the auxiliary electrode 350 from each other. The bank 450 may be formed of an organic insulating material, for example, polyimide resin, acryl resin, benzocyclobutene BCB, and etc., but is not limited to these materials.

In the OLED device according to another embodiment of the present invention, the partition 400 is disposed on the auxiliary electrode 350, and the auxiliary electrode 350 is exposed to and connected with the second electrode 600 without using a mask pattern. A partition cover 500 is disposed on the partition 400, wherein a width of an upper surface of the partition cover 500 is relatively small, so that it is possible to reduce or minimize a contact area with the mask, to reduce or prevent the mask from being contaminated by foreign matters, and thus, to reduce or prevents defects caused by the foreign matters of the mask.

Also, in the OLED device according to another embodiment of the present invention, the partition 400 is disposed in-between the organic emitting layer 550 to separate the organic emitting layer 550, and also disposed in-between the second electrode 600 to separate the second electrode 600, and an encapsulation layer 650 is provided in the space between the partition 400 and the bank 450, to thereby fixedly provide the encapsulation layer 650. The encapsulation layer 650 presses the organic emitting layer 550 and the second electrode 600, to thereby enhance an adhesive strength between the organic emitting layer 550 and the second electrode 600. Accordingly, even when an impact is applied by repetitive bending actions, it is possible to reduce or prevent the organic emitting layer 550 from being separated from the cathode electrode 600, to thereby improve reliability.

FIGS. 4A to 4F are cross-sectional views illustrating a method of manufacturing an OLED device according to another embodiment of the present invention, as applied to the OLED device illustrated in FIG. 3. Thus, the same reference numbers will be used throughout the drawings to refer to the same or like parts, and a repetitive explanation for the material and structure of each of the elements will be omitted.

Figure 4A:
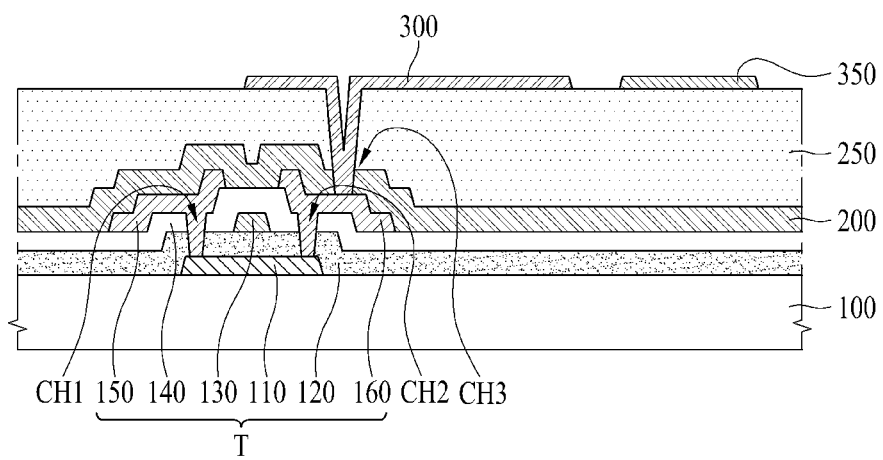
FIGS. 4A to 4F are cross-sectional views illustrating a method of manufacturing the OLED device according to another embodiment of the present invention.

First, as illustrated in FIG. 4A, the thin film transistor (T) is formed on the substrate 100, the passivation layer 200 is provided on the thin film transistor (T), and the planarization layer 250 is provided on the passivation layer 200.

The process of forming the thin film transistor (T) may include providing the active layer 110 on the substrate 100, providing the gate insulating film 120 on the active layer 110, providing the gate electrode 130 on the gate insulating film 120, providing the insulating interlayer 140 on the gate electrode 130, providing the first and second contact holes (CH1, CH2) in the insulating interlayer 140 and the gate insulating film 120, and providing the source and drain electrodes 150 and 160 on the insulating interlayer 140 and connecting the source and drain electrodes 150 and 160 with the active layer 110 via the first and second contact holes (CH1, CH2). However, it should be appreciated that various methods generally known to those in the art can be applied to form the thin film transistor (T).

After providing the passivation layer 200 and the planarization layer 250, the third contact hole (CH3) for exposing the drain electrode 160 of the thin film transistor (T) is provided in the passivation layer 200 and the planarization layer 250, and then the first electrode 300 is electrically connected with the drain electrode 160 via the third contact hole (CH3).

The process of providing the first electrode 300 on the planarization layer 250 and the process of the auxiliary electrode 350 on the planarization layer 250 may be carried out at the same time. That is, the first electrode 300 and the auxiliary electrode 350 may be simultaneously manufactured on the same layer, that is, the planarization layer 250.

Figure 4B:
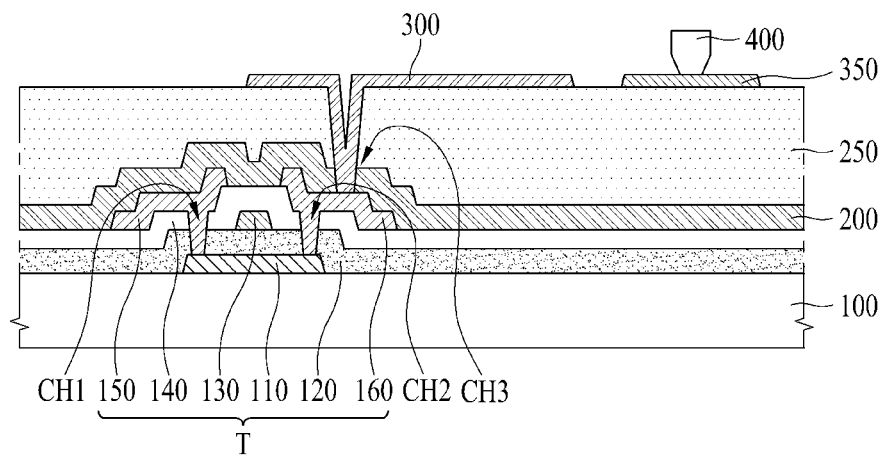

Then, as illustrated in FIG. 4B, the partition 400 is provided on the auxiliary electrode 350. The partition 400 is formed of the photo-sensitive material whose portion exposed to light is cured, which may be formed of negative type photoresist (PR). In case of a negative photoresist process, a portion exposed to light remains by a chemical combination, and another portion which is not exposed to light is removed by a developing solution. Accordingly, under the condition that a partition material is deposited on the auxiliary electrode 350, and that the mask is disposed above the partition material, light is irradiated thereon, whereby the partition material covered by the mask is removed, and the partition material exposed to light remains to be the partition 400. At this time, if the partition material is laterally irradiated with light, the lower surface of the partition 400 may be formed in a reverse-tapered shape. Accordingly, the width of the upper surface of the partition 400 is larger than the width of the lower surface of the partition 400.

Figure 4C:
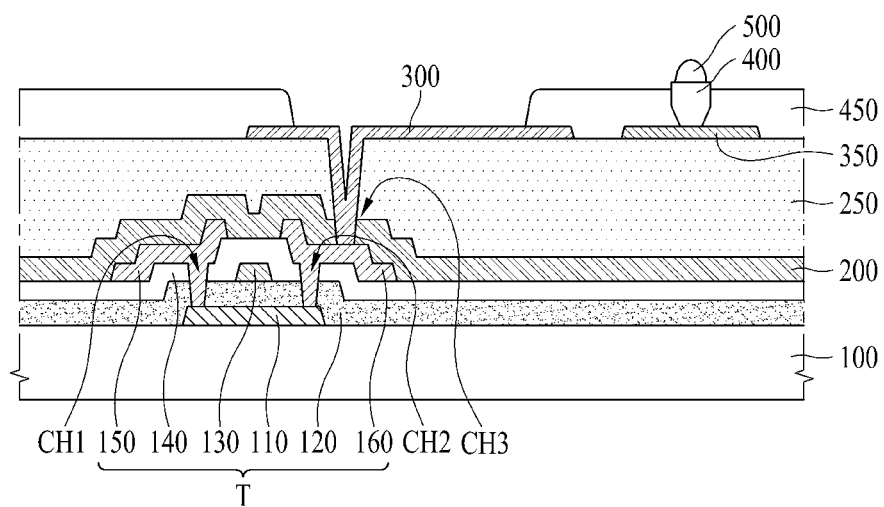

Then, as illustrated in FIG. 4C, the bank 450 is provided at a lateral side of the first electrode 300 and the auxiliary electrode 350, and the partition cover 500 is provided on the partition 400.

The process of providing the partition cover 500 on the partition 400 and the process of providing the bank 450 at the lateral side of the first electrode 300 and the auxiliary electrode 350 may be carried out at the same time. The partition cover 500 and the bank 450 may be formed of the same material. In this case, the width of the upper surface of the partition cover 500 is smaller than the width of the lower surface of the partition cover 500.

Then, the bank 450 is laterally irradiated with light, whereby the bank 450 is removed from the space between the partition 400 and the auxiliary electrode 350. Thus, it is possible to prepare the gap space between the lower surface of the partition 400 and the auxiliary electrode 350, whereby the second electrode 600 and the encapsulation layer 650 may be prepared in the gap space for the following process.

Figure 4D:
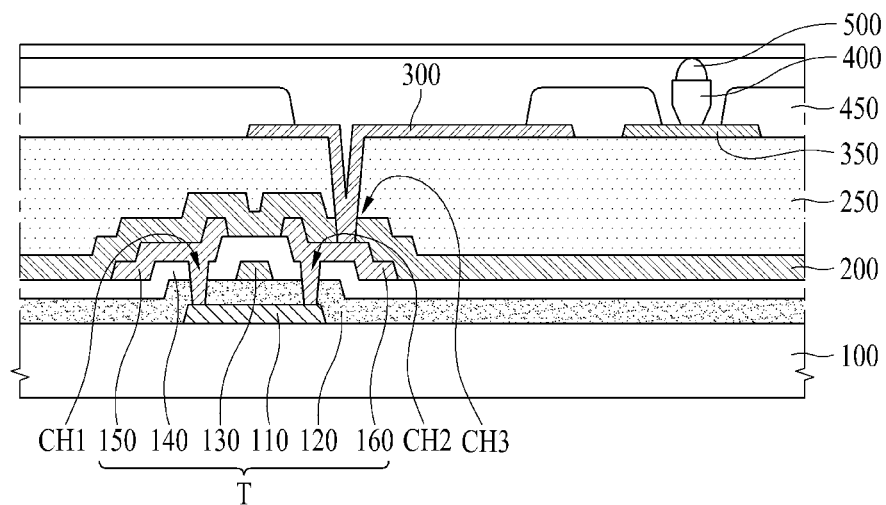
Figure 4E:
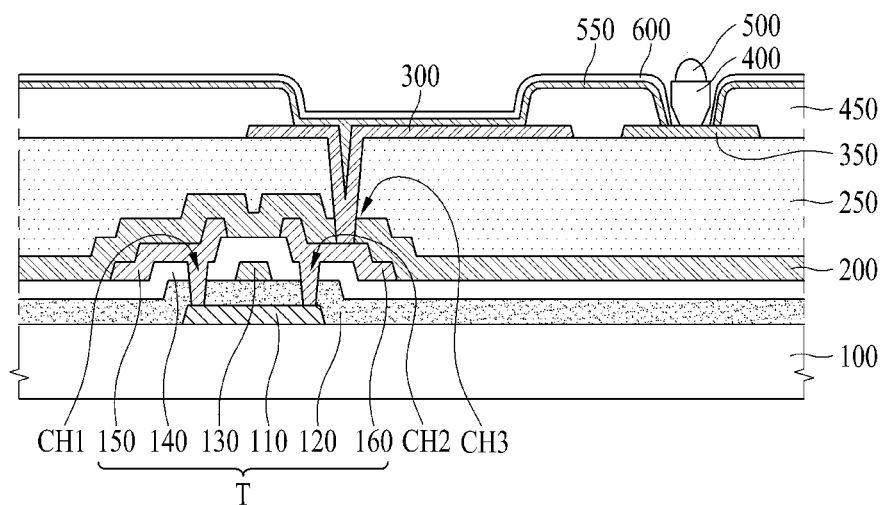

As illustrated in FIG. 4D, a mask is disposed above the partition cover 500. As illustrated in FIG. 4E, the organic emitting layer 550 is provided on the first electrode 300. The organic emitting layer 550 may be provided on an entire surface of the substrate 100, and then the second electrode 600 may be provided on the organic emitting layer 550.

Figure 4F:
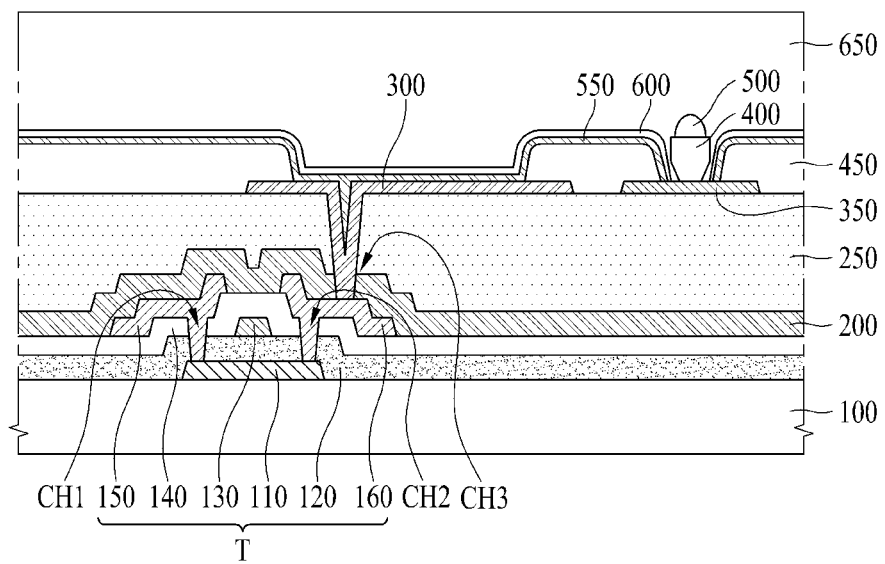

As illustrated in FIG. 4F, the encapsulation layer 650 is provided on the second electrode 600. At this time, the encapsulation layer 650 may be provided in the space between the partition 400 and the auxiliary electrode 350 and the space between the partition 400 and the bank 450.

In the OLED device according to another embodiment of the present invention, the partition cover 500 is disposed on the partition 400, wherein the width of the upper surface of the partition cover 500 is relatively small, so that it is possible to reduce or minimize a contact area with the mask, to reduce or prevent the mask from being contaminated by foreign matters, and to thereby reduce or prevent defects caused by the foreign matters of the mask. Also, in the method of manufacturing the OLED device according to another embodiment of the present invention, the bank 450 and the partition cover 500 for preventing the mask from being contaminated by foreign matters are manufactured at the same time so that the partition cover 500 is provided on the partition 400 without increasing the number of masks, to thereby improve reliability of the OLED device.

According to the embodiment of the present invention, the partition cover 500 with the upper surface having a relatively-small width is disposed on the partition 400 so that it is possible to reduce or minimize the contact area with the mask, to reduce or prevent the mask from being contaminated by foreign matters, and to thereby reduce or prevent defects caused by the foreign matters of the mask.

Also, the bank 450 and the partition cover 500 for preventing the mask from being contaminated by foreign matters are manufactured at the same time so that the partition cover 500 is provided on the partition 400 without increasing the number of masks, to thereby improve reliability of the OLED device.

Also, the adhesive strength between the organic emitting layer 550 and the second electrode 600 is improved by the partition 400 so that it is possible to reduce or prevent separation between the organic emitting layer 550 and the cathode electrode, thereby improving reliability of the OLED device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display (OLED) device comprising:
    a thin film transistor on a substrate;
    a first electrode electrically connected with the thin film transistor;
    an organic emitting layer on the first electrode, the organic emitting layer separated by a partition;
    a plurality of banks at a lateral side of the first electrode;
    a gap between the partition and the banks;
    a partition cover on the partition;
    a second electrode on the organic emitting layer; and
    an encapsulation layer on the second electrode;
    wherein the encapsulation layer is provided in the gap between the lower surface of the partition and the upper surface of the bank, and
    wherein a width of an upper surface of the partition cover is smaller than a width of a lower surface of the partition cover.

2. The OLED device according to claim 1, further comprising an auxiliary electrode disposed in the same layer as the first electrode, wherein the partition is disposed on the auxiliary electrode.

3. The OLED device according to claim 2, wherein the second electrode is electrically connected with the auxiliary electrode.

4. The OLED device according to claim 1, wherein a width of an upper surface of the partition is larger than a width of a lower surface of the partition.

5. The OLED device according to claim 1, wherein the thin film transistor includes an active layer, a gate insulating film, a gate electrode, an insulating interlayer, a source electrode, and a drain electrode.

6. The OLED device according to claim 5, wherein the active layer is formed of a silicon-based semiconductor material or an oxide-based semiconductor material.

7. The OLED device according to claim 5, wherein a first contact hole for exposing a first end of the active layer is provided in the gate insulating film and the insulating interlayer, and wherein a second contact hole for exposing a second end of the active layer is provided in the gate insulating film and the insulating interlayer.

8. The OLED device according to claim 7, wherein the source electrode is connected with the first end of the active layer via the first contact hole, and the drain electrode is connected with the second end of the active layer via the second contact hole.

9. The OLED device according to claim 7, further comprising a passivation layer on the film transistor, and a planarization layer on the passivation layer,
    wherein a third contact hole for exposing the drain electrode is prepared in the passivation layer and the planarization layer.

10. The OLED device according to claim 9, wherein the first electrode on the planarization layer, and the first electrode is connected with the drain electrode via the third contact hole.

11. The OLED device according to claim 1, wherein the first electrode is formed of indium-tin-oxide (ITO) or indium-zinc-oxide (IZO).

12. The OLED device according to claim 1, wherein the first electrode has a multi-layered structure including one or more metal materials of molybdenum (Mo), alloy (MoTi) of molybdenum (Mo) and titanium (Ti), aluminum (Al), argentums (Ag) and APC (Ag;Pb;Cu).

13. The OLED device according to claim 1, wherein the partition cover and the bank is formed of a same material including one or more organic insulating materials of polyimide resin, acryl resin and benzocyclobutene BCB.

* * * * *